(12) United States Patent
Hanawa (10) Patent No.: US 7,956,985 B2
(45) Date of Patent: Jun. 7, 2011

(54) EXPOSURE APPARATUS

(75) Inventor: Riichirou Hanawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 12/368,914

(22) Filed: Feb. 10, 2009

(65) Prior Publication Data

US 2009/0208884 A1  Aug. 20, 2009

(30) Foreign Application Priority Data

Feb. 15, 2008 (JP) ................... 2008-035155

(51) Int. Cl.
*G03B 27/52* (2006.01)
*G03B 27/42* (2006.01)

(52) U.S. Cl. .......................................... 355/55; 355/53

(58) Field of Classification Search .................... 355/53, 355/55; 356/399–401; 250/548
See application file for complete search history.

(56) References Cited

U.S. PATENT DOCUMENTS

| 5,337,247 | A | | 8/1994 | Hamaguchi |
| 6,163,366 | A | * | 12/2000 | Okamoto et al. ............... 355/53 |
| 6,342,942 | B1 | * | 1/2002 | Uzawa ........................... 355/53 |
| 6,674,509 | B2 | * | 1/2004 | Suzuki ........................... 355/53 |
| 7,446,853 | B2 | * | 11/2008 | Fukuhara et al. ............... 355/53 |

FOREIGN PATENT DOCUMENTS

JP  04-037114 A  2/1992

* cited by examiner

*Primary Examiner* — Hung Henry Nguyen
(74) *Attorney, Agent, or Firm* — Canon U.S.A., Inc. IP Division (57) ABSTRACT

An exposure apparatus includes a driver used for one of height, inclination, curvature-of-field, magnification, and rotation corrections, and a controller configured to control a substrate stage so that it can change an exposure area from a first shot to a third shot even if a moving distance of the substrate stage from the first shot to the second shot is smaller than that from the first shot to the third shot, if a time period necessary for the driver to transfer from a correction state for the first shot to a correction state for the second shot is longer than a time period necessary for the substrate stage to move the exposure area from the first shot to the second shot, and a time period necessary for the driver to transfer from a correction state for the first shot to a correction state for the third shot.

12 Claims, 10 Drawing Sheets

EXPOSURE APPARATUS

BACKGROUND OF THE INVENTION

1. Field of the Invention

The present invention relates to an exposure apparatus.

2. Description of the Related Art

A scanning exposure apparatus is conventionally known which exposes a pattern of an original (such as a mask and a reticle) onto a substrate via a projection optical system by utilizing light from a light source and by scanning the original and the substrate. The substrate has a plurality of shots (each shot being an area to be exposed by one exposure action); when the pattern of the original is transferred onto one shot, an exposure area is stepped to another shot by a substrate stage. By repeating the exposing and stepping, the original's pattern is exposed onto all shots on the substrate.

A throughput is an important parameter in the exposure, and the exposure sequence among shots affects the throughput. Japanese Patent Laid-Open No. ("JP") 04-037114 determines the exposure sequence among shots so as to minimize moving distances of the substrate stage in a scanning direction (such as a Y direction) and in a non-scanning or sub-scanning direction (such as an X direction) orthogonal to the optical-axis direction (such as a Z direction) and the scanning direction. JP 04-037114 attempts to improve the throughput by minimizing the moving amount of the substrate stage or the driving time period.

The exposure apparatus corrects a curvature of field ("COF") of an exposure area by driving a COF correcting lens in a projection optical system for focus correction. However, the driving responsibility of the COF correcting lens is lower than that of the substrate stage; even when the substrate stage moves to an exposure area to a target shot, the COF correcting lens does not reach the target position and the exposure may not immediately be ready to start. In addition, for a highly precise alignment, a rotation correction around the Z axis for each shot is more important than a rotational correction around the Z axis for the overall substrate. The responsibility of the rotational driving of the substrate stage around the Z axis is lower than that of the driving in the X or Y direction. From the above, a method described in JP 04-037114 cannot necessarily improve the throughput.

SUMMARY OF THE INVENTION

The present invention provides an exposure apparatus having a high throughput.

An exposure apparatus according to one aspect of the present invention configured to expose a pattern of an original onto a substrate by utilizing light from a light source includes a projection optical system configured to project the pattern of the original onto the substrate, a substrate stage configured to move the substrate in each of two directions orthogonal to an optical-axis direction of the projection optical system so as to change an exposure area among shots on the substrate, each shot being an area to be exposed by one exposure, and the shots including a first shot, a second shot, and a third shot, a driver used for one of a height correction of the shot of the substrate in the optical-axis direction of the projection optical system, an inclination correction relative to the two directions orthogonal to the optical-axis direction of the projection optical system, a curvature-of-field correction for the shot, a magnification correction for the shot, and a rotational correction around an optical axis for the shot, and a controller configured to control the substrate stage so as to move the exposure area from the first shot to the third shot even when a moving distance of the substrate stage which moves the substrate and changes the exposure area from the first shot to the second shot is smaller than that from the first shot to the third shot, if a time period necessary for the driver to transfer from a correction state for the first shot to a correction state for the second shot is longer than a time period necessary for the substrate stage to move the exposure area from the first shot to the second shot, and a time period necessary for the driver to transfer from the correction state for the first shot to a correction state for the third shot.

Further features of the present invention will become apparent from the following description of exemplary embodiments with reference to the attached drawings.

DESCRIPTION OF THE EMBODIMENTS

Figure 1:
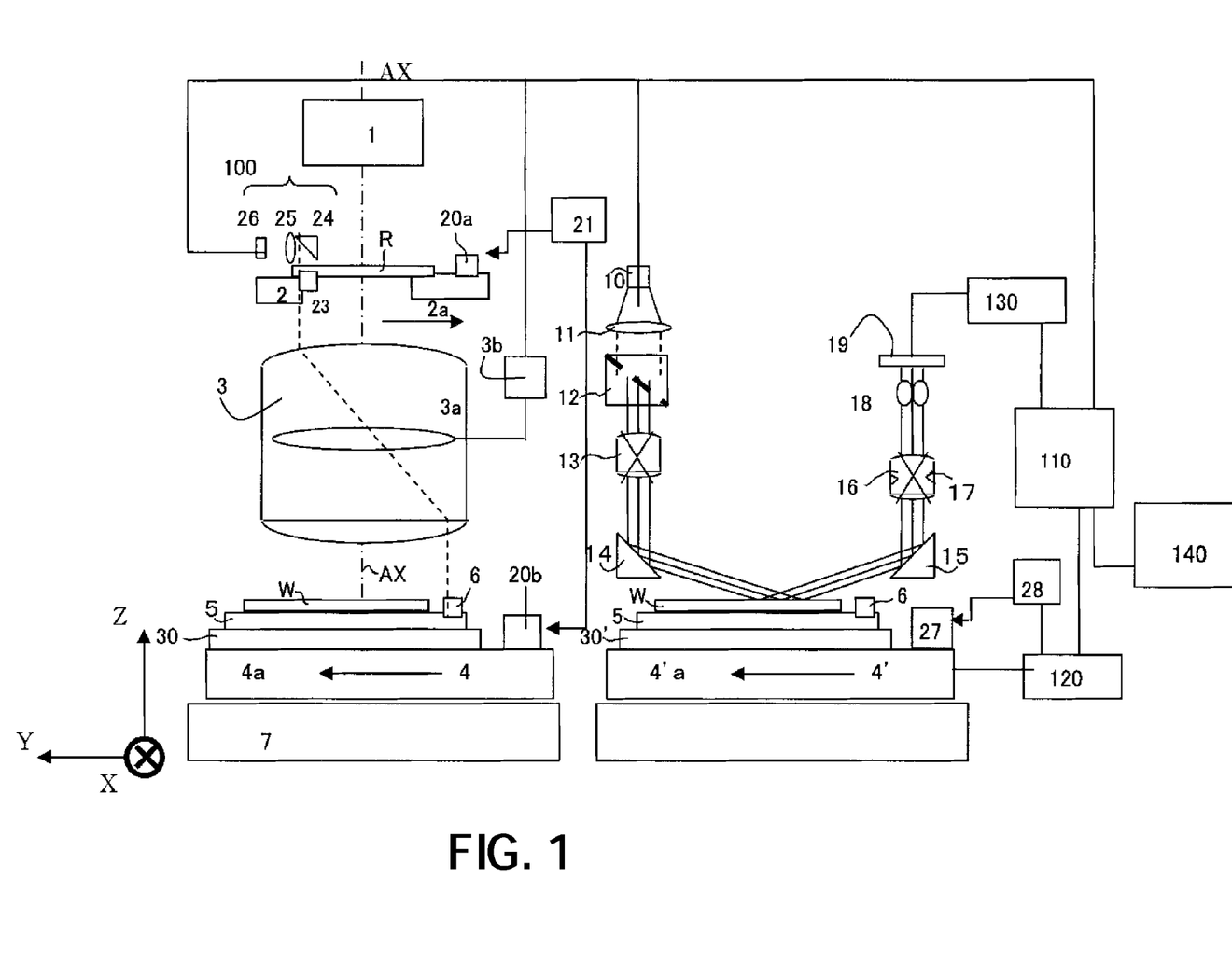
FIG. 1 is a block diagram of an exposure apparatus according to one aspect of the present invention.

Referring now to the accompanying drawings, a description will be given of an exposure apparatus according to one aspect of the present invention. The exposure apparatus exposes a pattern of a reticle R as an original onto a substrate W by utilizing light from a light source, as shown in FIG. 1. The exposure apparatus includes an illumination apparatus 1, a reticle stage 2, a projection optical system 3, a substrate stage 4, a controller 110, and other components, and exposes the pattern of the reticle R onto the substrate W by a step-and-scan manner. The present invention is applicable to a step-and-repeat exposure apparatus. AX is an optical axis of the projection optical system 3, and the optical-axis direction is parallel to the Z direction.

The illumination apparatus 1 illuminates the reticle R, and includes a light source and an illumination optical system. The light source can use a laser or a mercury lamp. The illumination optical system is an optical system configured to uniformly illuminate the reticle R.

The reticle R includes a circuit pattern or an image, and is supported and driven by the reticle stage 2. The reticle stage 2 has a bar mirror 20, and a coordinate of the reticle stage 2 in the XY directions is always measured by an interferometer 21. The diffracted light from the reticle R is projected onto the substrate W via the projection optical system 3. The reticle R and the wafer W have an optically conjugate relationship, and the reticle pattern is transferred onto the substrate W by synchronously scanning the reticle R and the wafer W with each other at a velocity ratio of a reduction magnification ratio. The reticle R absorbed and fixed onto the reticle stage 2 is scanned in a Y direction of an arrow 2a shown in FIG. 1 at a constant velocity, and correctively driven in an X direction orthogonal to the arrow 2a so that it can always maintain a target coordinate position.

The projection optical system 3 projects a reticle pattern onto the substrate W at a reduction ratio. The projection optical system 3 can use any one of a dioptric optical system, a catadioptric optical system, and a catoptric optical system. Immersion exposure may be implemented by immersing in the liquid a final optical system of the projection optical system 3, which is closest to the substrate W. When it is assumed that an object plane is a surface of the reticle R on which a reticle pattern is formed, an image plane formed on the substrate is a surface perpendicular to the Z direction in FIG. 1. The projection optical system 3 has a lens 3a configured to correct a curvature of field ("COF") of the substrate W, and a driver 3b drives the lens 3a. The driver 3b is controlled by the controller 110.

The substrate W is a wafer in this embodiment, but may be a liquid crystal substrate in another embodiment, and the substrate W represents an object to be exposed. A photoresist is applied onto a surface of the substrate W. The pattern of the reticle R is exposed onto the substrate W, and an area to be exposed by one exposure action is referred to as a shot. The substrate W has a plurality of shots of the same patterned structure in a matrix shape.

The substrate W is absorbed and fixed onto a substrate chuck 5 that serves as a holding jig. The substrate chuck 5 is fixed onto a fine-movement stage 30. The fine-movement stage (driver) 30 is mounted on the substrate stage 4. The substrate stage 4 is an XY stage that can move in the X and Y directions, and forms a correction system having a plurality of axes so as to align the reticle pattern image with each shot on the substrate W. Thus, the substrate stage 4 moves the substrate W in two directions (XY directions) orthogonal to the Z direction so as to change the exposure area among the shots on the substrate W. Thus, the fine-movement stage 30 is a stage that can move in the Z direction or rotate around each of the XYZ-axes. The substrate stage 4 is provided on a stool 7. A position of the substrate stage 4 in the XY directions is always measured by the interferometer 21 that refers to the bar mirror 20b. The substrate chuck 5 has a reference mark 6.

Similar to the substrate stage 4, other substrate stage 4' and fine-movement stage 30' are arranged on the stool 7 or another stool 7 for exposures and measurements so that they can move in plural axes directions. The substrate chuck 5 and the substrate W are initially set on the substrate stage 4'.

Reference numerals 10 to 19 denote components in a measurement optical system configured to measure a surface position and inclination of the substrate W. The measurement optical system measures a height position of each shot or an arbitrary shot on the substrate W relative to a reference mark 6 on the substrate chuck 5 while the substrate W is set on the substrate stage 4'. The controller 110 stores measurement data in a memory 130. The reference mark 6 on the substrate chuck 5 is made, for example, with a thin metallic film or a metal plate, so that the reference mark 6 is approximately as high as the substrate W in order to improve the measurement accuracy.

Reference numeral 10 denotes a light source, which includes an illumination unit that irradiates light of a white lamp or a highly bright emitting diode having a plurality of different peak wavelengths. Reference numeral 11 denotes a collimator lens which receives the light from the light source 10, and emits a parallel luminous flux having an approximately uniform intensity distribution. Reference numeral 12 denotes a prism-shaped slit member made by adhering a pair of prisms so that their bevel surfaces can oppose to each other, and a plurality of (e.g., twenty-five) openings are provided by utilizing a light shielding film, such as chrome in the adhesion surfaces. Reference numeral 13 denotes a double-sided telecentric optical system configured to lead independent twenty-five luminous fluxes that have passed a plurality of pinholes of the slit member 12 to twenty-five measurement spots MS on a surface of a substrate W via a mirror 14. A plurality of luminous fluxes is arranged in a direction perpendicular to a paper plane shown in FIG. 1. A plane having the pinholes and a plane containing a surface of the substrate satisfy the Scheinmpflug's condition with respect to the optical system 13.

Figure 2:
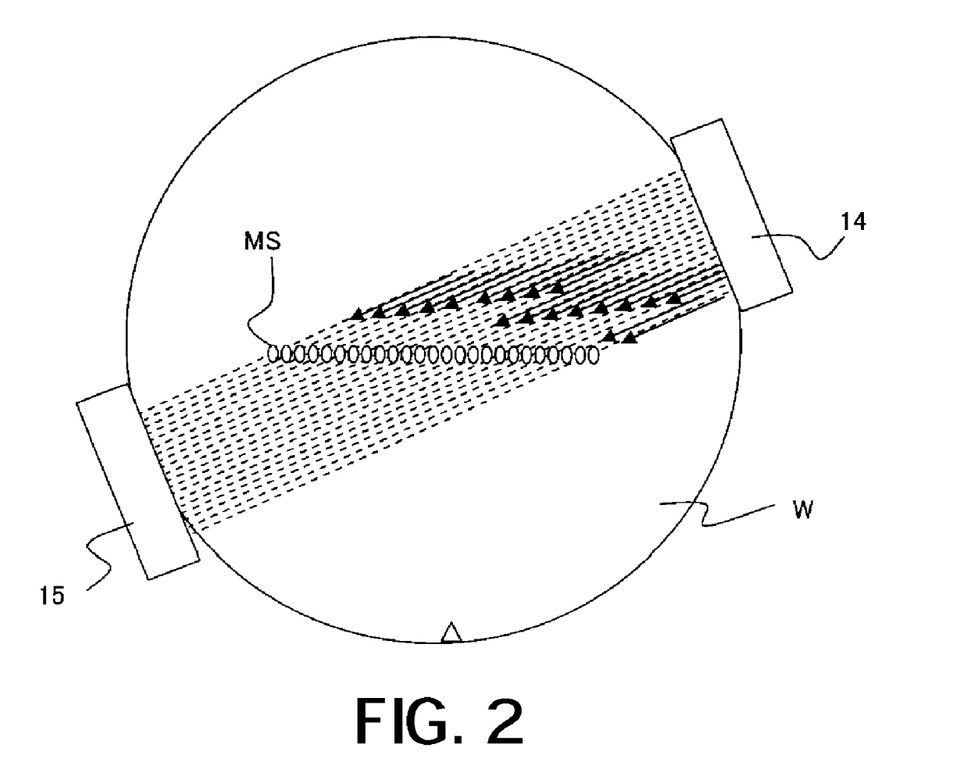
FIG. 2 is a plane view showing a relationship between a substrate and luminous fluxes used to measure a surface position on the substrate by the measurement optical system shown in FIG. 1.

An incident angle between a luminous flux from the light source 10 and a line (or an optical axis) perpendicular to the surface of the substrate is 70° or higher. Twenty-five luminous fluxes that have passed the optical system 13 are incident and imaged on independent measurement spots MS in the patterned area, as shown in FIG. 2. These twenty-five measurement spots MS in FIG. 2 are arranged in the X direction as wide as or longer than a width of the exposure slit in the sub-scanning direction (perpendicular to the scanning direction) of the exposure slit in the substrate stage 4'. For example, arranging the twenty-five measurement spots MS over a length twice as long as the exposure slit width in the substrate stage 4' enables at least two shots to be simultaneously measured, shortening a shot measurement time period. The luminous fluxes are incident from a direction that is rotated by θ° to the Y axis or the scanning direction 4'a on the XY plane so that the twenty-five measurement spots MS can be independently observed within the substrate surface.

Reference numeral 16 is a double-sided telecentric light receiving optical system, which receives twenty-five reflected luminous fluxes from the substrate surface via the mirror 15. A stop 17 is provided in the light receiving optical system 16, commonly to the twenty-five measurement spots, and configured to cut the high-order diffracted light (noise light) that may occur by a circuit pattern in the substrate. The luminous fluxes that have passed the light receiving optical system 16 re-image by individual twenty-five correction lenses in the correction optical system group 18 so that they can form spot light having the same size on a detection plane of a photoelectric conversion means group 19.

Components 16 to 18 on the light receiving side do not cause a position of a pinhole image on a measurement plane to change due to a local inclination of each measurement spot MS, and the pinhole image on the measurement plane changes in response to a height change in the Z direction. This embodiment uses, for example, twenty-five one-dimensional CCD line sensors for the photoelectric conversion means group 19, but may use a plurality of two-dimensional position measurement elements.

This embodiment transfers the substrate W absorbed on the substrate chuck 5 from the substrate stage 4' to the substrate stage 4, and performs a focus operation of the substrate W by utilizing a position measurement unit 100. The position measurement unit 100 utilizes a focusing mark 23 provided in a patterned area or at a borderline of the reticle R, and includes a half-mirror 24, a condenser lens 25, and a measurement unit 26. The mark 23 includes, for example, a pinhole. The pinhole transmits the light from the illumination apparatus 1, and the light is imaged near the reference mark 6 on the substrate chuck 5 via the projection optical system 3. The light reflected on the reference mark 6 re-images near the mark 23 via the projection optical system 3. When the mark 23 is focused on the reference mark 6, the light quantity that passes the pinhole becomes maximum. The measurement unit 26 measures this maximum light quantity by utilizing the half-mirror 24 and the condenser lens 25 while driving the Z stage, and informs a measurement result to the controller 110. The controller 110 controls the stage position in the Z direction via the driver 120 so that the substrate stages 4 and 4' stop at positions that provide the maximum light quantities.

The driver 120 sequentially moves each shot on the substrate surface to an exposure position in accordance with various types of preset information that is set at a console 140 by moving the substrate stages 4 and 4' in the XY plane. A height position of each shot relative to the reference mark 6, which is previously measured with the substrate chip 4' and stored in the memory 130, is input into the controller 110. The driver 120 drives the Z stage of the substrate stage 4 so that each shot is located at a focus position based on the height position. The exposure follows.

Figure 10:
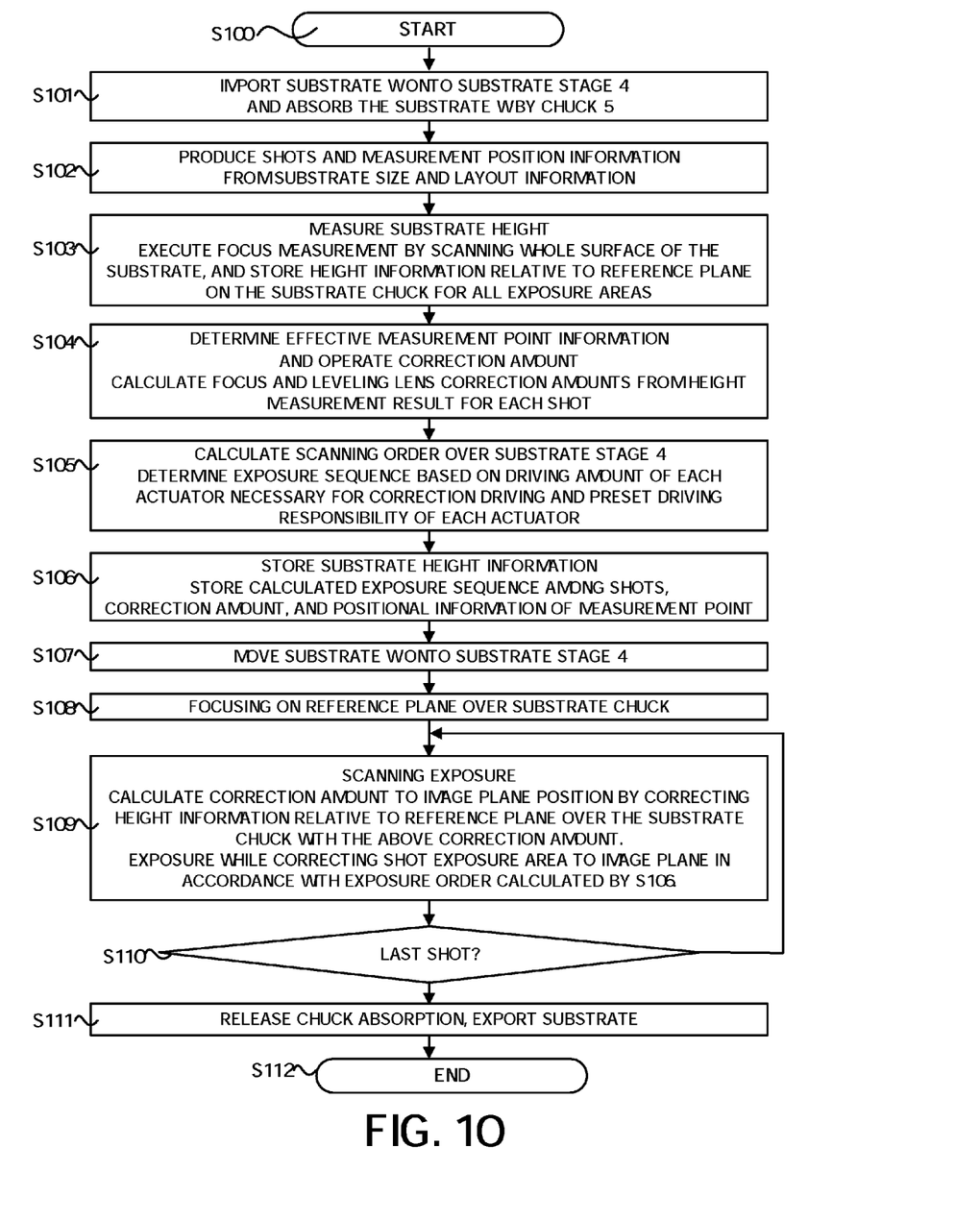
FIG. 10 is a flowchart for explaining an exposure method to which the exposure sequence according to the first and second embodiments are applicable.

Referring now to FIG. 10, a description will be given of an exposure method according to this embodiment.

When starting control (step ("S") 100), the controller 110 imports a substrate W in the substrate stage 4' via a transportation hand (not shown) (S101), and fixes and absorbs the substrate W on the chuck 5. The controller 110 obtains an intra-shot measurement interval and a measurement timing variation amount between adjacent shots based on substrate size and layout information, and forms and stores them as measurement position information (S102). The substrate size and layout information includes, for example, various types of preset information, a size of a scanning measurement area, shot arrangement information, a scanning velocity, and a CCD storage time period set at the console 140.

Figure 3:
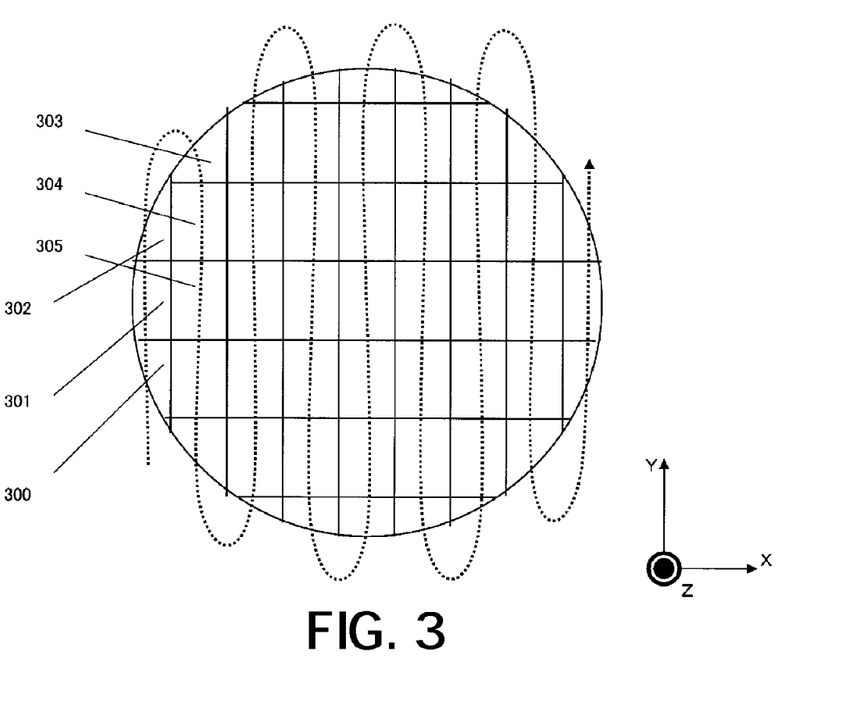
FIG. 3 is a plane view showing a shot arrangement on the substrate shown in FIG. 1.

Next, the controller 110 utilizes the measurement optical system (10-19) and the substrate stage 4' to measure all shots on the substrate W by synchronously scanning the shots in order shown by a dotted line in FIG. 3 (S103). After the substrate stage 4' is accelerated to the predetermined speed in front of the shot 300, the measurement spots MS in the shot 300 are continuously scanned at a constant speed and the height positions of the measurement spots MS are measured. Next, the shot 301 and the shot 302 are continuously measured. As soon as the measurement of the shot 302 is completed, the deceleration follows and the movement to the next row in the X direction is promptly started. After the substrate stage 4' is accelerated to the predetermined velocity in front of the shot 303, the measurement spots MS of the shots 303, 304, 305, etc. are continuously scanned and the height positions of the measurement spots MS are measured. After the measurements are completed, the deceleration promptly follows and the movement to the next row in the X direction is started. Next, when it reaches an acceleration starting point, the substrate stage 4' is accelerated in the opposite direction; the measurement spots MS of a plurality of shots in the Y direction are continuously scanned at a constant velocity and the measurements of the height positions of the measurement spots MS are repeated. The memory 130 stores height positions of the whole surface of the substrate.

The controller 110 checks for an effective measurement spot and determines a surface position (S104). The controller 110 performs a variety of corrections for the substrate W based on the height positions of the measurement spots MS measured by the measurement optical system (10-19). For example, it calculates a least-square approximation plane based on a value of each measurement spot. A height of the approximation plane represents a focus correction amount, and an inclination of the approximation plane represents a leveling correction amount. In addition, a secondary coefficient of a quadratic approximation curve representing a measurement value of each measurement spot MS to an X position of each measurement spot MS is a curvature-of-field ("COF") correction amount.

Next, the controller 110 determines the exposure sequence by weighing a driving amount of each actuator necessary for corrective driving and a preset driving band of each actuator on the basis of a calculated focus correction amount, leveling correction amount and COF correction amount (S105). Prior art expose a first shot and a second shot in this order, when a moving distance of the substrate stage 4 becomes minimum when the substrate stage 4 moves the substrate W so that an exposure area can change from the first shot to the second shot. On the other hand, the controller 110 considers the driver's driving responsibility (or a driving time period), and sets the exposure sequence among the shots. Assume that T1 is a time period necessary for the driver to transfer from a correction state for the first shot to a correction state for the second shot. Also, T2 is a time period necessary for the substrate stage 4 to move the exposure area from the first shot to the second shot, and T3 is a time period necessary for the driver to transfer from the correction state of the first shot to a correction state for a third shot. In this case, the controller 110 controls the substrate stage 4 so as to move the exposure area from the first shot to the third shot instead of moving it from the first shot to the second shot, when the time period T1 is longer than the time period T2 and the time period T3.

Thus, when the driving responsibility of the driver is lower than that of the substrate stage, or when the driving time period of the driver is longer than that of the substrate stage, the exposure sequence is determined so as to reduce the driving time period of the driver. This configuration can reduce a time period (down to zero) from when the substrate stage 4 moves a target shot and to when an exposure is started.

The driver is used for one of a height correction of the shot of the substrate W in the Z direction, an inclination correction relative to each of the XY directions, a COF correction for the shot, a magnification correction for the shot, and a rotation correction around an optical axis (or the Z axis) for the shot. The driver may be used for one of the corrections, which requires the longest time period. Thereby, a driving time period can be reduced more effectively.

The driver 110 stores in the memory 130 the exposure sequence calculated by S105, an intra-shot surface position correction driving amount calculated by S104, and the position information of the effective measurement point (S106). Next, the controller 110 moves to the substrate stage 4 the substrate W that is absorbed on the substrate chuck 5 (S107). Next, the controller 110 executes focusing using the mark 23 and the reference mark 6 (S108). Next, the controller 110 corrects the height information to the reference mark 6 by using a correction amount, calculates a correction amount to the image plane position, and exposes the shot in exposure sequence calculated by S105 while correcting the image plane of the shot (S109). The controller 110 determines whether scanning exposures of all shots on the substrate W are completed (S110) and, if not, the flow returns to S109 to continue the scanning exposure. The controller 110 exports the substrate W from the substrate stage 4 when determining that the exposures of all shots end (S111), and finishes a series of exposure sequences (S112).

First Embodiment

Figure 4A:
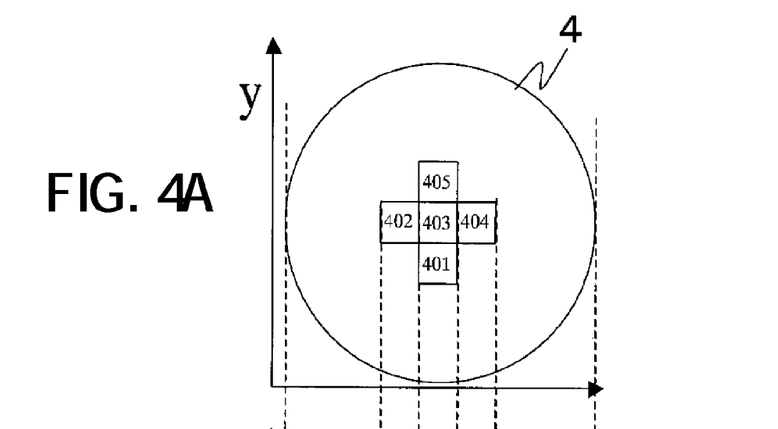
FIGS. 4A-4E show a curvature of field component that occurs in a specific shot.
Figure 4B:
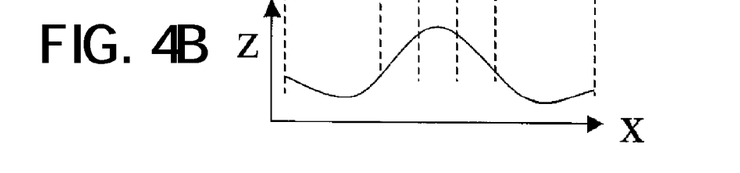
Figure 4C:
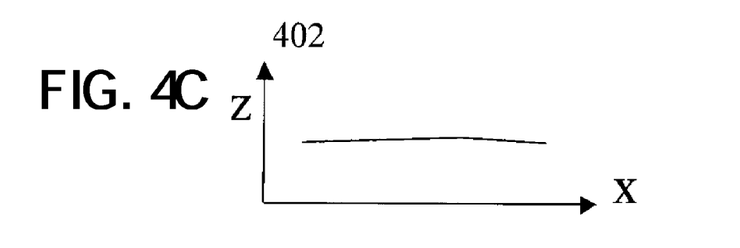
Figure 4D:
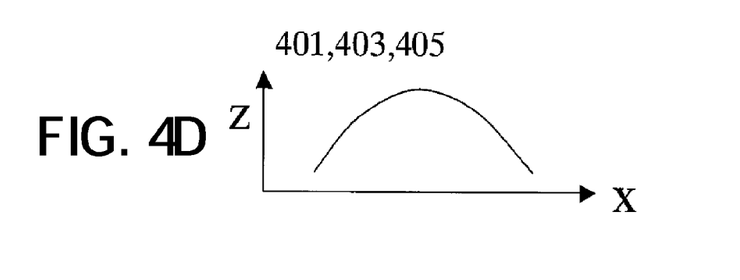
Figure 4E:
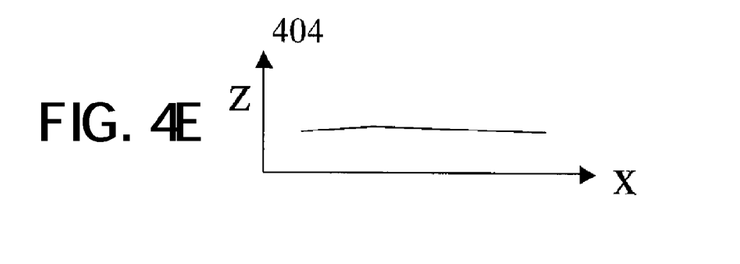

Next follows a detailed description of S105. FIG. 4A is a plane view showing shots 401-405 on the substrate W. Assume that the substrate W has an undulation in the Z direction as shown in FIG. 4B, in a Y direction perpendicular to the paper plane. The undulation in the Z direction becomes maximum at the center of the shot 403. The Z distribution relative to the X direction is shown in FIG. 4C for the shot 402, in FIG. 4D for the shots 401, 403, and 405, and in FIG. 4E for the shot 404, after X-directional leveling components are removed from the shots 401 to 405. It is understood from FIGS. 4C to 4E that each of the shots 401, 403, and 405 has a COF larger than that of each of the shots 402 and 404 and therefore a COF correction amount for each of the shots 401, 403, and 405 is larger than that of each of the shots 402 and 404.

Figure 5A:
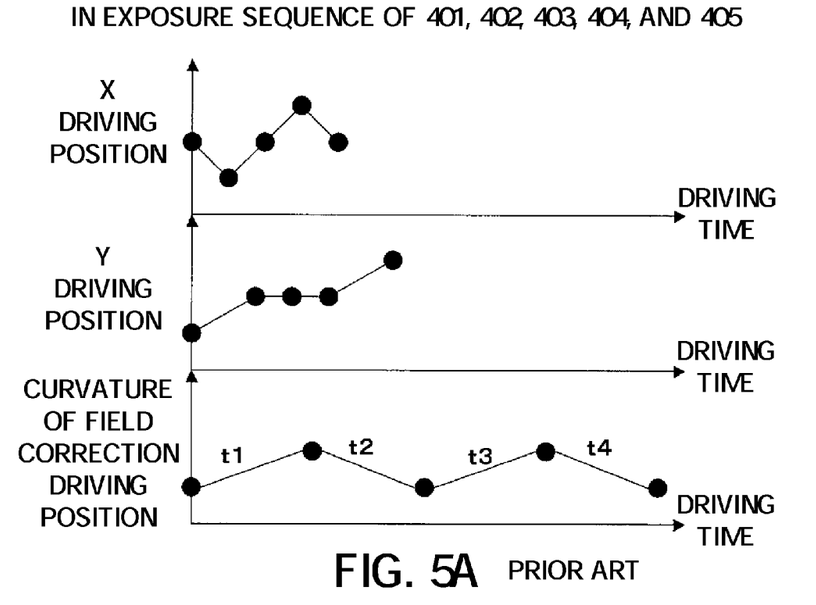
FIG. 5A is a diagram showing a driving time when the substrate shown in FIG. 4 is exposed in the conventional exposure sequence.
Figure 5B:
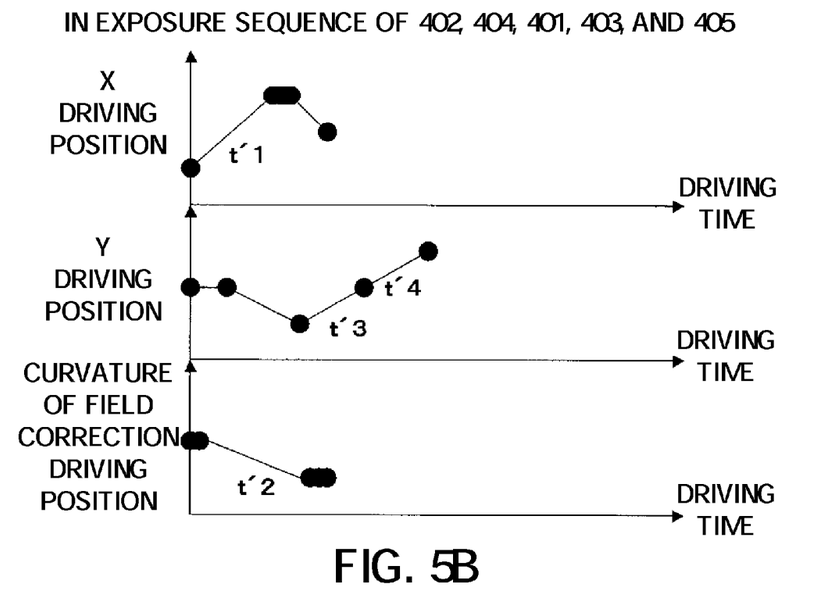
FIG. 5B is a diagram showing a driving time when the substrate shown in FIG. 4 is exposed in the exposure sequence according to a first embodiment.

FIG. 5A shows a relationship between a driving time and a driving position of each actuator in the conventional exposure sequence in which the X-directional driving and Y-directional driving become minimum or when five shots are exposed in ascending order. FIG. 5B shows a relationship between a driving time and a driving position of each actuator in exposure sequence according to this embodiment or when five shots are exposed in order of the shots 402, 404, 401, 403, and 405. The five points in each graph are driving positions of the actuator for each shot, and an interval between two adjacent points is a driving time period. When it is assumed that t1 to t4 and t'1 to t'4 are the longest driving time periods of the actuator among the shots, totals of the time periods from t1 to t4 and from t'1 to t'4 are inter-shot driving time periods necessary to complete exposures of the five shots.

According to the exposure sequence shown in FIG. 5A, the COF correction driving amount greatly changes whenever each shot is changed, and a total of the inter-shot driving time periods necessary to finish the exposures of all these five shots becomes longest. This is because a control band for the driver 3b that drives the COF correcting lens 3a is generally lower than that of the driver 120 for the substrate stage 4, and a driving time period necessary to drive the lens 3a becomes longer. On the other hand, according to the exposure sequence shown in FIG. 5B, a total of the COF correction driving amounts necessary to complete the exposures of all of these five shots becomes least and the inter-shot driving time period necessary to complete the exposure in the COF correction driving is shorter than that of FIG. 5A. A total value of the Y-directional driving amount becomes larger than that shown in FIG. 5A due to the exposure sequence that emphasizes the COF correction driving amount.

Figure 6A:
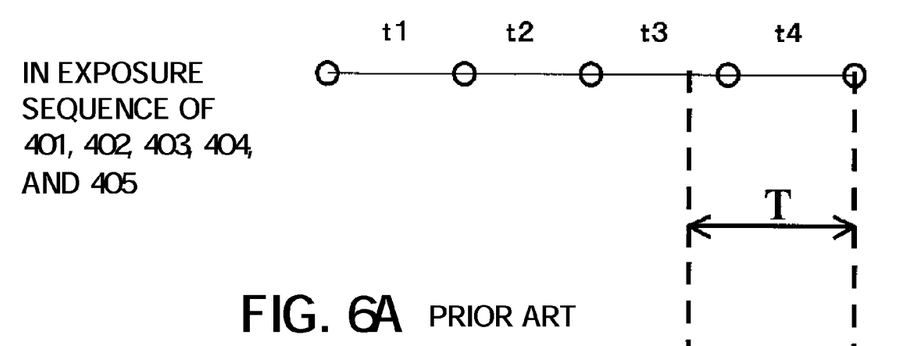
FIG. 6A is a total value of actuator's driving time periods in the conventional exposure sequence.
Figure 6B:
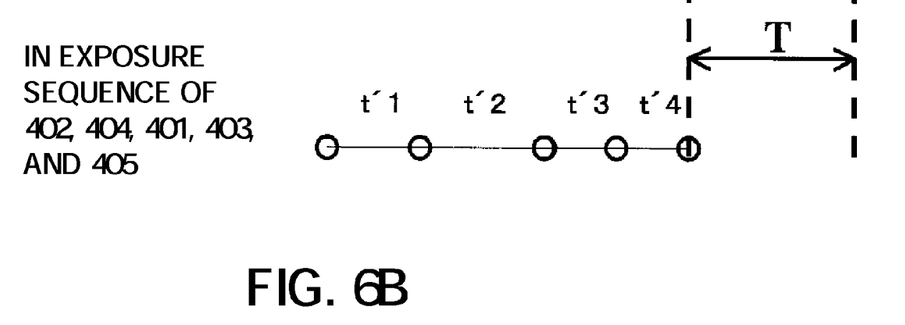
FIG. 6B is a total value of actuator's driving time periods in the exposure sequence according to the first embodiment.

FIG. 6A shows a total of the driving time periods (t'1+t'2+t'3+t'4) in the exposure sequence shown in FIG. 5A. FIG. 6B shows a total of the driving time periods (t'1+t'2+t'3+t'4) in the exposure sequence shown in FIG. 5B. When FIG. 6A is compared with FIG. 6B, the exposure sequence of this embodiment can reduce the exposure time period of the conventional exposure sequence by a time period T. In this example, when it is assumed that the first shot is the shot 402, the prior art moves the exposure area to the shot 403 as the second shot, whereas this embodiment moves the exposure area to the shot 404 as the third shot.

While this embodiment determines the exposure sequence by calculating two types of totals of the driving time periods, i.e., in the context of FIG. 5A and in the context of FIG. 5B, the exposure sequence having the shortest total driving time period by comparing all exposure sequences of total driving time periods with one another. However, as the number of shots increases, this method requires a long time period to calculate the exposure sequence and ultimately to start an exposure, degrading the productivity of the wafer. Accordingly, a description will be given of a second embodiment which narrows down candidate exposure sequences in calculating the optimal exposure sequence.

Second Embodiment

Figure 7A:
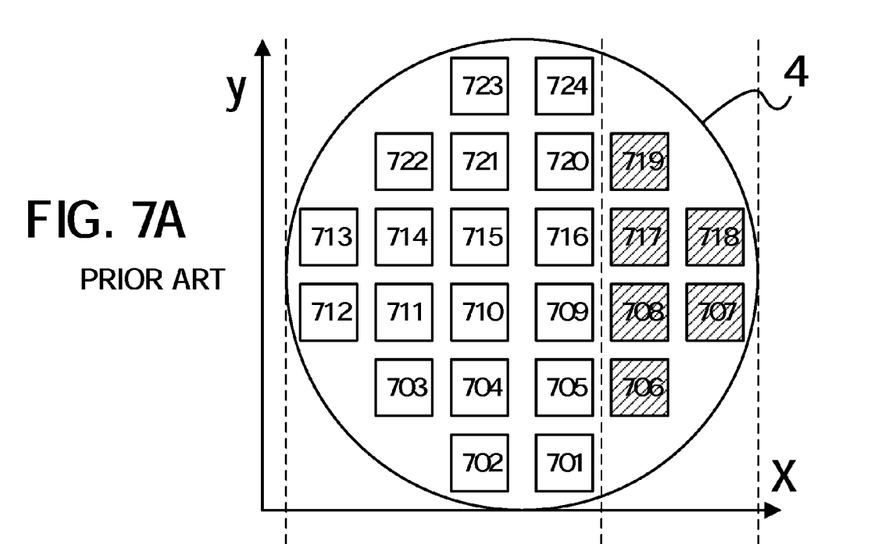
FIGS. 7A and 7B are diagrams showing the conventional exposure sequence.
Figure 7B:
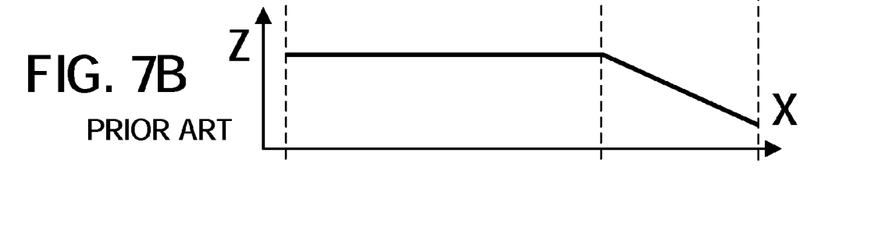

FIGS. 7A and 7B show the conventional exposure sequence, and define a sub-scanning direction of the substrate stage 4 as the X direction and a scanning direction as the Y direction in the scanning exposure. FIG. 7A is a top view of the substrate W. In FIG. 7A, the substrate W has shots 701-724, and the conventional exposure sequence exposes these shots in ascending order. FIG. 7B shows the substrate W on the XZ plane (or the height information of the substrate W) where the right end part of the substrate W uniformly inclines in the Z negative direction. More specifically, X-direction leveling greatly differs between the shots 705 and 706, between the shots 708 and 709, between the shots 716 and 717, and between the shots 719 and 720.

The conventional exposure sequence is determined so as to minimize the driving amounts of the actuator for the substrate stage 4 in the X direction and in the Y direction. However, in exposing the top right end part of the substrate W, an inclination amount (referred to as "X-directional leveling" hereinafter) around an axis as the scanning direction is extremely different from the orientation of the substrate stage 4 in the previous exposure. Thus, a linear motor (not shown) for the X-directional leveling driving greatly drives relative to an inclination amount around the axis as the scanning direction in exposing the right end part. More specifically, an inclination amount greatly changes in changing from the shot 705 to the shot 706, from the shot 708 to the shot 709, from the shot 716 to the shot 717, and from the shot 719 to the 720, and it takes a long time for the actuator to move to a target value. This negatively affects the productivity of the substrate W, or the focus accuracy may deteriorate because a driving target value to be corrected is unavailable in attempting to maintain the productivity of the substrate W.

Accordingly, this embodiment classifies shots into a plurality of groups in accordance with a corrective driving amount (or threshold) of the actuator, and the controller 110 controls the substrate stage 4 so as to provide the exposure in groups. Since a driving band is different for each actuator, the threshold is set for each actuator. The smaller number of groups may be efficient by reducing the number of thresholds. This is because as the number of groups increases, the number of combinations of the exposure sequences among these groups increases and a calculation time period of the exposure sequence increases.

The intra-group exposure sequence is set so as to provide the shortest distance in the X-directional driving and the shortest distance in the Y-directional driving, simplifies the combination of the exposure sequence in the same group, and narrows down the exposure sequences. The inter-group exposure sequence is set so as to make shortest the longest time period for the actuator, and shortens the driving time period for the inter-group movements. More specifically, in moving from one shot in one group to another shot in another group, the order that makes shortest the longest driving time period of the actuator is determined. At this time, the above intra-group exposure sequence is maintained. Thus, the optimal exposure sequence candidate can be previously narrowed down through grouping from the driving amount.

Figure 9A:
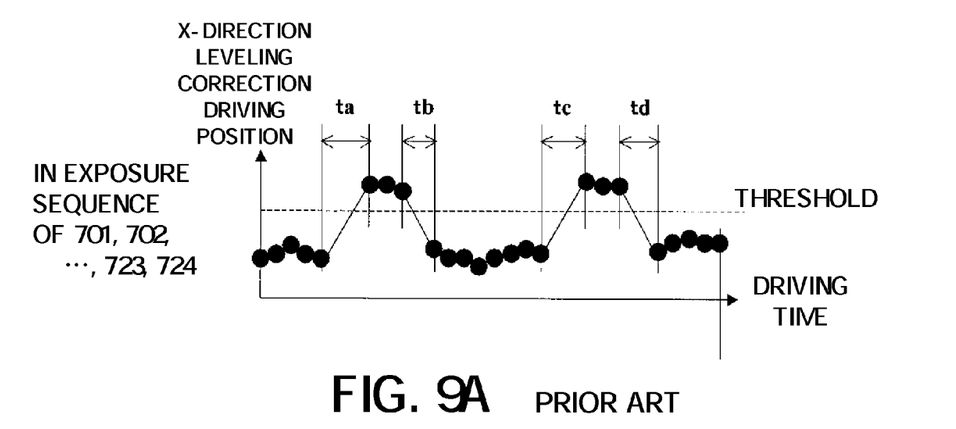
FIG. 9A is a total value of actuator's driving time periods in the conventional exposure sequence.

FIG. 9A shows a relationship between a driving time and a driving position for the X-directional leveling in the exposure sequence shown in FIG. 7. Since the X-directional leveling driving position greatly differs, long driving time periods ta, tb, tc, and td occur from the shot 705 to the shot 706, from the shot 708 to the shot 709, from the shot 716 to the shot 717, and from the shot 719 to the shot 720, respectively.

Figure 8A:
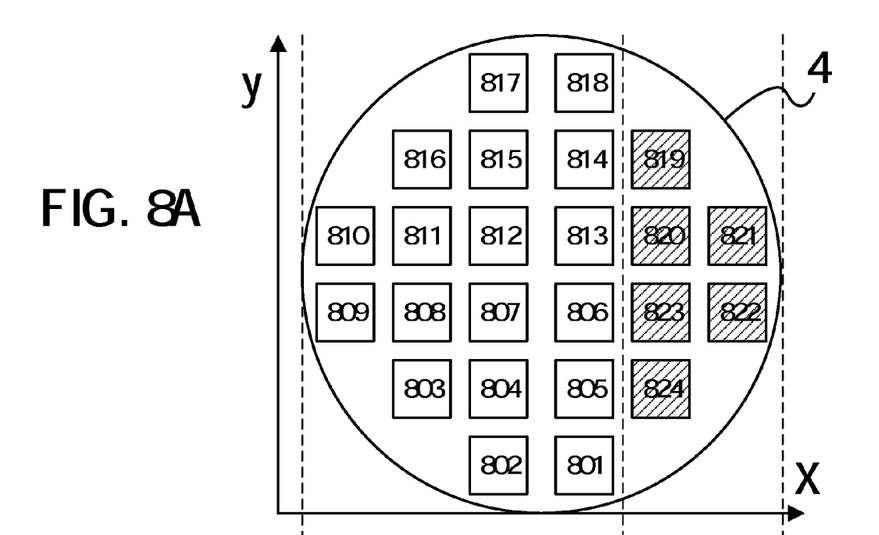
FIGS. 8A and 8B are diagrams showing the exposure sequence according to a second embodiment.
Figure 8B:
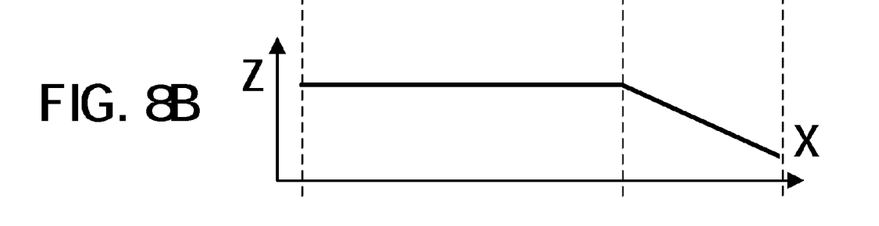

FIGS. 8A and 8B show the exposure sequence of this embodiment, and define a sub-scanning direction of the substrate stage 4 as the X direction and a scanning direction as the Y direction in the scanning exposure; FIG. 8A is a top view of the substrate W. In FIG. 8A, the substrate W has shots 801-824, and the exposure sequence of this embodiment exposes these shots in groups. This embodiment classifies the shots into driving positions below a threshold, and driving positions equal to or above the threshold, or more specifically into the group A to which the shot 801 to the shot 818 belong, and the group B to which the shot 819 to the shot 824 belong. FIG. 8B shows the substrate W on the XZ plane (height information of the substrate W), and the right end part on the substrate W uniformly inclines in the Z negative direction. A shape of the substrate shown in FIGS. 8A and 8B is the same as that of the substrate shown in FIGS. 7A and 7B. More specifically, the X-directional leveling greatly differs between the shots 805 and 824, between the shots 806 and 823, between the shots 813 and 820, and between the shots 814 and 819.

The shots in the same group are exposed so as to make shortest an X-directional driving distance and a Y-directional driving distance, and in the group A, the shots are exposed in order of the shots 801, 802 to 817, and 818 or in order of the shots 802, 801 to 818, and 817. In the group B, the shots are exposed in order of the shots 819, 820 to 823, and 824 or in order of the shots 824, 823 to 820, and 819. In each group, the exposure sequence starting from the top end part on the substrate W is also conceivable, but this example will not be explained for simple description.

Next, the inter-group exposure sequence is determined. The determined intra-group final shot in the group A is the shot 817 or 818. A next shot to the shot 817 or 818 is determined from the group B. The first shot in the group B is the shot 819 or 824. Therefore, four types of exposure sequences from the group A to the group B are conceivable, e.g., from the shot 817 to the shot 819, from the shot 817 to the shot 824, from the shot 818 to the shot 819, and from the shot 818 to the shot 824. When it is assumed that a route from the shot 818 to the shot 819 makes shortest the longest driving time period of the actuator, the exposure sequence of this embodiment is set so as to expose the shot 801 to 824 in ascending order, as shown in FIG. 8A.

Figure 9B:
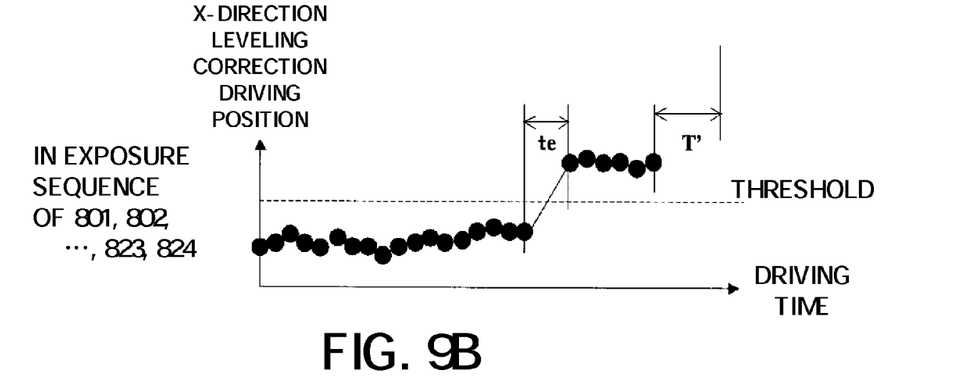
FIG. 9B is a total value of actuator's driving time periods in the exposure sequence according to the first embodiment.

FIG. 9B shows a relationship between a driving time period and a driving position for the X-directional leveling in the exposure sequence shown in FIG. 8A. Since only a driving time period "te" occurs due to the driving that exceeds the threshold in FIG. 9B, when a total of the X-directional leveling driving time periods over all shots is compared with the conventional exposure sequence shown in FIG. 7A, it can be shortened by T'. In this example, the shot 805 as the first shot and the shot 806 as the third shot belong to the same group, and the shot 824 as the second shot belongs to a group different from the group of the first and third shots.

The first and second embodiments discuss the shot's COF correction and the X-directional leveling (θ-X) correction by an example that determines the priority order from a driving amount other than the X driving amount and the Y driving amount. However, the Z-directional correction, Y-directional leveling (θ-Y) correction, the magnification correction of the shot, or the rotation correction around the optical axis (or the Z axis) of the shot may also be used. As described above, the driver 3b performs the COF correction of the shot. Leveling (such as the Z correction, the θ-X correction, and the θ-Y correction) and the rotation correction around the Z axis are performed by a fine-movement stage 30. The magnification correction is performed, for example, by a driver (not shown) configured to mechanically deform a glass plate in the projection optical system 3, or to move the lens in the projection optical system 3. In that case, in order to shorten a total of the driving time periods, the exposure sequence may be determined on the basis of the driver used for the longest correction among these corrections. While this embodiment indicates the exposure sequence determination method by the focus correction driving, the present invention is also applicable to alignment correction driving when the alignment correction amount is previously calculated before an exposure.

Next follows a manufacturing method of a device, such as a semiconductor integrated circuit device and a liquid crystal display device, according to one embodiment of the present invention. Here, a manufacturing method of a semiconductor device will be described in an example.

A semiconductor device is manufactured by a pretreatment process of making an integrated circuit on a wafer, and a post-treatment process of completing as a product the integrated circuit chip produced on the wafer by the pretreatment process. The pretreatment process includes the steps of exposing a substrate, such as a wafer and a glass plate, on which a photosensitive agent is applied by using the above exposure apparatus, and developing the substrate. The post-treatment process includes an assembly step (dicing and bonding), and a packaging step (sealing).

The device manufacturing method of this embodiment can improve the throughput because it uses the above exposure apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-035155, filed Feb. 15, 2008, which is hereby incorporated by reference herein in its entirety.

What is claimed is:

1. An exposure apparatus configured to expose a pattern of an original onto a substrate by utilizing light from a light source, the exposure apparatus comprising:

a projection optical system configured to project the pattern of the original onto the substrate;

a substrate stage configured to move the substrate in each of two directions orthogonal to an optical-axis direction of the projection optical system so as to change an exposure area among shots on the substrate, each shot being an area to be exposed by one exposure action, and the shots including a first shot, a second shot, and a third shot, wherein a moving distance of the substrate stage which moves the substrate and changes the exposure area from the first shot to the second shot is smaller than a moving distance of the substrate stage which moves the substrate and changes the exposure area from the first shot to the third shot;

a driver used for one of a height correction of the shot of the substrate in the optical-axis direction of the projection optical system, an inclination correction relative to the two directions orthogonal to the optical-axis direction of the projection optical system, a curvature-of-field correction for the shot, a magnification correction for the shot, and a rotational correction around an optical axis for the shot; and a controller configured to obtain a time period necessary for the driver to transfer from a correction state for the first shot to a correction state for the second shot and a time period necessary for the driver to transfer from the correction state for the first shot to a correction state for the third shot, and control the substrate stage so as to expose the first shot, the third shot, and the second shot in order when the time period for the driver to transfer from a correction state for the first shot to a correction state for the second shot is longer than a time period for the substrate stage to move the exposure area from the first shot to the second shot, and a time period for the driver to transfer from the correction state for the first shot to a correction state for the third shot.

2. The exposure apparatus according to claim 1, wherein the driver is used to a correction that requires the longest time period among the height correction of the shot of the substrate in the optical-axis direction of the projection optical system, the inclination correction relative to the two directions orthogonal to the optical-axis direction of the projection optical system, the curvature-of-field correction for the shot, the magnification correction for the shot, and the rotational correction around the optical axis for the shot.

3. The exposure apparatus according to claim 1, wherein the controller determines an exposure sequence among the shots so as to provide the smallest total of driving time periods for all the shots with respect to the substrate stage and the driver.

4. The exposure apparatus according to claim 1, wherein the shot is classified into a plurality of groups in accordance with a corrective driving amount of the driver,
wherein the first shot and the third shot belong to the same group, and the second shot belongs to a group different from the group of the first shot and the third shot, and
wherein the controller controls the substrate stage so as to provide exposures in groups.

5. The exposure apparatus according to claim 4, wherein the controller controls the substrate stage so as to minimize a moving distance of the substrate stage in the same group.

6. The exposure apparatus according to claim 4, wherein the controller controls the substrate stage so as to minimize a moving distance of the substrate stage in moving the exposure area between two shots that belong to different groups.

7. A device manufacturing method comprising:
exposing a substrate using an exposure apparatus; and
developing the substrate that has been exposed,
wherein the exposure apparatus is configured to expose a pattern of an original onto the substrate by utilizing light from a light source, and
wherein the exposure apparatus includes:
a projection optical system configured to project the pattern of the original onto the substrate;
a substrate stage configured to move the substrate in each of two directions orthogonal to an optical-axis direction of the projection optical system so as to change an exposure area among shots on the substrate, each shot being an area to be exposed by one exposure action, and the shots including a first shot, a second shot, and a third shot, wherein a moving distance of the substrate stage which moves the substrate and changes the exposure area from the first shot to the second shot is smaller than a moving distance of the substrate stage which moves the substrate and changes the exposure area from the first shot to the third shot;

a driver used for one of a height correction of the shot of the substrate in the optical-axis direction of the projection optical system, an inclination correction relative to the two directions orthogonal to the optical-axis direction of the projection optical system, a curvature-of-field correction for the shot, a magnification correction for the shot, and a rotational correction around an optical axis for the shot; and a controller configured to obtain a time period necessary for the driver to transfer from a correction state for the first shot to a correction state for the second shot and a time period necessary for the driver to transfer from the correction state for the first shot to a correction state for the third shot, and control the substrate stage so as to expose the first shot, the third shot, and the second shot in order when the time period for the driver to transfer from a correction state for the first shot to a correction state for the second shot is longer than a time period for the substrate stage to move the exposure area from the first shot to the second shot, and a time period for the driver to transfer from the correction state for the first shot to a correction state for the third shot.

8. The method according to claim 7, wherein the driver is used to a correction that requires the longest time period among the height correction of the shot of the substrate in the optical-axis direction of the projection optical system, the inclination correction relative to the two directions orthogonal to the optical-axis direction of the projection optical system, the curvature-of-field correction for the shot, the magnification correction for the shot, and the rotational correction around the optical axis for the shot.

9. The method apparatus according to claim 7, wherein the controller determines an exposure sequence among the shots so as to provide the smallest total of driving time periods for all the shots with respect to the substrate stage and the driver.

10. The method according to claim 7, wherein the shot is classified into a plurality of groups in accordance with a corrective driving amount of the driver,
wherein the first shot and the third shot belong to the same group, and the second shot belongs to a group different from the group of the first shot and the third shot, and
wherein the controller controls the substrate stage so as to provide exposures in groups.

11. The method according to claim 10, wherein the controller controls the substrate stage so as to minimize a moving distance of the substrate stage in the same group.

12. The method according to claim 10, wherein the controller controls the substrate stage so as to minimize a moving distance of the substrate stage in moving the exposure area between two shots that belong to different groups.

* * * * *